United States Patent [19]

Sano et al.

[11] 4,115,739

[45] Sep. 19, 1978

[54] POWER AMPLIFIER

[75] Inventors: Nobuya Sano, Nara; Hiroshi Goto, Katano; Yutaka Hirota, Toyonaka, all of Japan

[73] Assignee: Matsushita Electric Industrial Co., Ltd., Japan

[21] Appl. No.: 788,324

[22] Filed: Apr. 18, 1977

[30] Foreign Application Priority Data

Apr. 28, 1976 [JP] Japan .................................. 51-49248
Oct. 26, 1976 [JP] Japan ................................ 51-129070

[51] Int. Cl.$^2$ ............................................. H03F 3/183
[52] U.S. Cl. .................................... 330/263; 330/202; 330/297
[58] Field of Search .............. 330/297, 200, 202, 203, 330/207 A, 251, 263, 264, 267, 268, 199

[56] References Cited

U.S. PATENT DOCUMENTS

| 3,233,185 | 2/1966 | Young ................................... 330/297 |
| 3,423,689 | 1/1969 | Miller et al. ...................... 330/200 X |
| 3,449,689 | 6/1969 | Harley ............................. 330/199 X |

OTHER PUBLICATIONS

Younge, "Bootstrapping Bias Supply Increases IC Voltage Capacity," Electronics, vol. 41, No. 22, Oct. 28, 1968, pp. 90, 91.

Primary Examiner—James B. Mullins
Attorney, Agent, or Firm—Burgess, Ryan and Wayne

[57] ABSTRACT

In order to eliminate distortion a power amplifier is biased to Class-A or Class-B operation and in order to minimize the power loss the supply voltage of a power source is decreased as much as possible and the power source is driven by another highly efficient power amplifier so as to follow an output voltage.

23 Claims, 11 Drawing Figures

POWER AMPLIFIER

BACKGROUND OF THE INVENTION

The present invention relates to a power amplifier which may eliminate distortion and may have a high power efficiency.

In general, the power amplifiers are biased to Class A, B, C or D. In a transistor complementary push-pull circuit biased to Class-A operation, the emitter currents continuously flow through two transistors so that the output is not subjected to the distortion due to the switching of these transistors. However, with a power amplifier biased to Class-B operation, the emitter current flows only during the positive or negative half cycle of the load current and does not flow during the negative or positive half cycle so that the distortion occurs every time when the emitter current is turned on and off.

The Class-A power amplifiers are therefore advantageous over the Class-B power amplifiers in that no switching distortion occurs, but the maximum power loss of the former is about five times as much as that of the latter so that the Class-B power amplifiers are by far advantageous over the Class-A power amplifiers.

In a Class-D power amplifier a switching element is turned on and off by a square waveform pulse-width modulated with an input signal, and the output from the switching element is derived through a low-pass filter. Since the voltage and current are not simultaneously applied to the switching element, the power loss is almost negligible and consequently the power efficiency is very high. However, in general the Class-D power amplifiers are not provided with a negative feedback because of the provision of a low-pass filter for removing the ripple of a switching frequency so that the elimination of distortion by a negative feedback cannot be made.

As a result of the above comparison among the Class-A, —B and -D power amplifiers, it can be said that the less the distortion, the higher the power loss becomes, and it had been extremely difficult to provide a power amplifier with less distortion yet with a high power efficiency.

SUMMARY OF THE INVENTION

One of the objects of the present invention is therefore to provide a power amplifier wherein a Class-A or -B amplifier stage drives a load in order to reduce the distortion, and in order to minimize power loss, the voltage of a power supply is lowered as much as possible and the power supply is driven by another highly efficient amplifier stage so as to follow an output voltage.

Briefly stated, to the above and other end the present invention provides a power amplifier comprising a first amplifier for driving a load in response to an input signal, a first power supply with a floating reference voltage or point for supply a voltage to the first amplifier, a second amplifier for driving the first power supply in response to the input signal, and a second power supply with a fixed reference voltage or point for supplying a voltage to the second amplifier.

BRIEF DESCRIPTION OF THE DRAWING

Same reference numerals are used to designate similar parts throughout the figures.

DESCRIPTION OF THE PREFERRED EMBODIMENTS

Prior Art, FIGS. 1 through 4

Prior to the description of the preferred embodiments of the present invention, the prior art power amplifier will be described, in FIG. 1. There is shown a typical prior art Class-A or -B power amplifier consisting of an input terminal 1, a constant voltage circuit 2, a first pair of transistors 3 and 4, emitter resistors 5 and 6, an output terminal 7, a load 8 and a first pair of power supplies 9 and 10.

Figure 2:
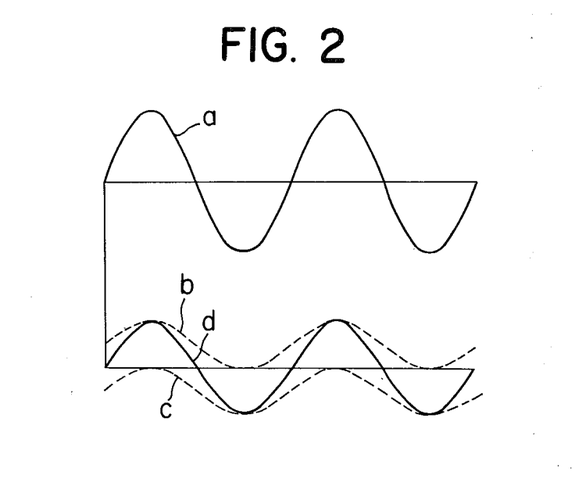
FIGS. 2 and 3 are views used for the explanation thereof.
Figure 3:
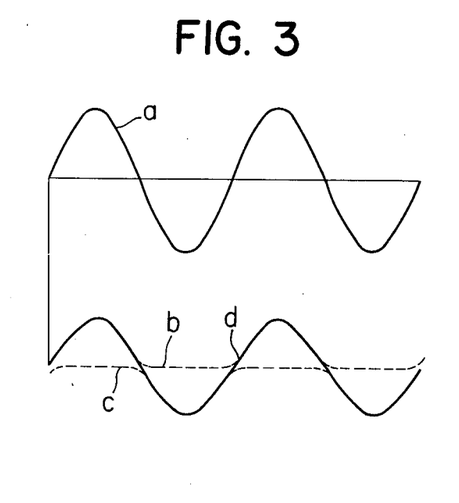

The waveforms of this circuit in Class-A and -B operations are shown in FIGS. 2 and 3, respectively, wherein $a$ denotes a voltage waveform at the output terminal 7; $b$ and $c$, emitter current waveforms of the transistors 3 and 4; and $d$, a current waveform of the load 8.

In Class-A operation, the emitter currents $b$ and $c$ flow continuously as shown in FIG. 2 so that no switching distortion occurs, but in Class-B operation the emitter currents flow only during the positive and negative cycles, respectively, of the load and do not flow during the negative and positive cycles as shown in FIG. 3. As a result, every time when the emitter current is turned on and off, the switching distortion occurs.

Figure 1:
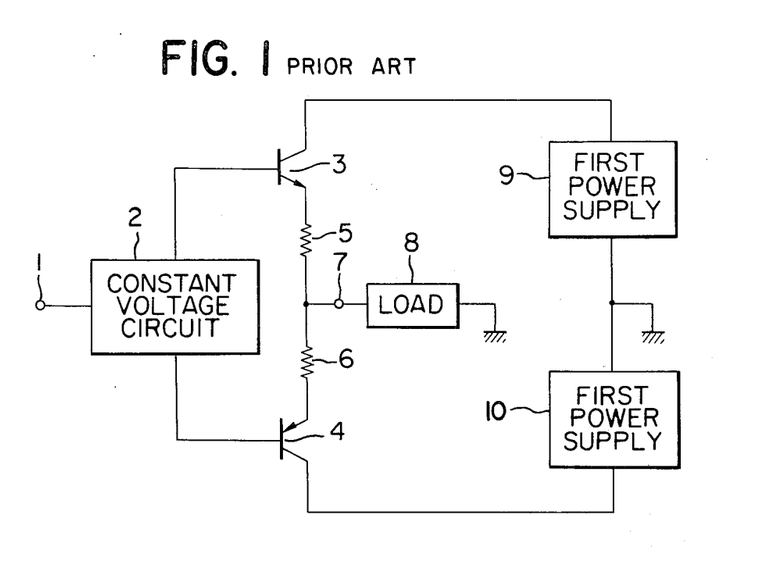
FIG. 1 is a block diagram of a prior art power amplifier.
Figure 4:
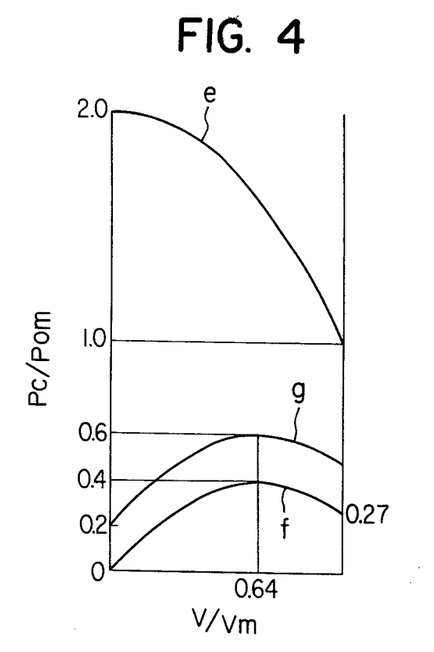
FIG. 4 shows the power loss characteristics of various power amplifiers.

In FIG. 4 the relationship between the power loss of the transistors 3 and 4 and the amplitude of output in the circuit shown in FIG. 1. The ratio of the output voltage V to the maximum output voltage Vm is plotted against the abscissa whereas the ratio of the power loss Pc of the transistors 3 and 4 to the maximum output Pom, against the ordinate. The curve $e$ denotes the power loss in Class-A operation and $f$, that in Class-B operation. It is assumed that the resistors 5 and 6 have a very small value so that the voltage drop across them may be negligible.

As described above, the Class-A operation of the power amplifier of the type shown in FIG. 1 is advantageous over Class-B operation in that no switching distortion occurs, but the Class-B operation is by far advantageous over the Class-A operation in that the maximum power loss of the latter is five times as much as that of the former.

Meanwhile in a Class-D power amplifier, the square waveform that is pulse-width modulated with input signals turns on and off a switching means whose output is derived through a low-pass filter. Since a voltage and current are not simultaneously applied to the switching means, the power loss is negligible and consequently the power efficiency is extremely high. However, the Class-D power amplifiers in general cannot be provided with a stable negative feedback because they include a low-pass filter in order to remove the ripples of a switching frequency. Therefore the elimination or reduction of distortion by the negative feedback cannot attained.

Figure 5:
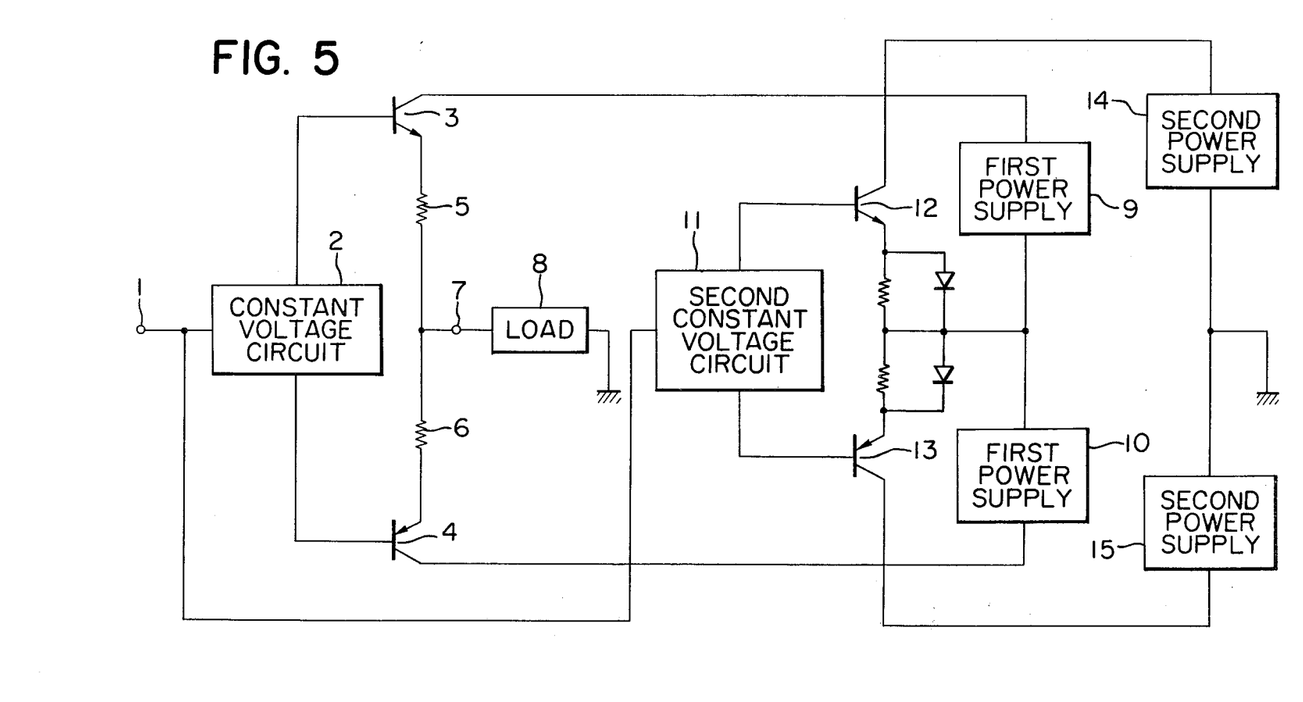
FIGS. 5 through 9 are circuit diagrams of a first through a third preferred embodiments of the present invention.

First Embodiment, FIG. 5

The first embodiment shown in FIG. 5 includes, in addition to the parts 1 through 10 shown in FIG. 1, a second constant voltage circuit 11, a second pair of transistors 12 and 13 and a second pair of power supplies 14 and 15.

A first amplifier stage consisting of the transistors 3 and 4 has an operating point for Class-A operation whereas a second amplifier stage consisting of the transistors 12 and 13 has an operating point for Class-B operation. The first amplifier stage drives the load 8 and the first pair of power supplies 9 and 10 supply the collector voltages of the transistors 3 and 4 in the first amplifier stage. The reference point or voltage of the first power supply 9 and 10 is floating and is driven by the second amplifier stage 12 and 13 whose collector voltages are supplied by the second power supply 14 and 15 whose reference point is grounded.

For Class-A operation, even with no input signal a current at least one half of the peak load current must be made to flow through the transistors 3 and 4 in the first amplifier stage. In order to minimize the power loss of the transistors 3 and 4, the voltage of the first power supply 9 and 10 must be made as low as possible. Since the second amplifier stage 12 and 13 is blased to Class-B operation, no current flows at no input signal so that all of the currents flowing into the transistors 3 and 4 in the first amplifier stage are supplied from the low-voltage first power supply 9 and 10 and the power loss of the first amplifier stage with no input signal may be considerably minimized as compared with the prior art Class-A power amplifiers.

The power loss $P_{col}$ of the first amplifier stage 3 and 4 with no input signal is expressed by $$P_{col} = 2I_o(\tfrac{1}{2} V_1 - I_o R_e)$$

where
$R_e$ = resistance of resistors 5 and 6,
$R_L$ = resistance of load 8,
$\pm\tfrac{1}{2}V_1$ and $\pm\tfrac{1}{2}V_2$ = voltages of first and second power supplies respectively, and
$I_o$ = current flowing through the first amplifier stage with no input signal.

When a voltage $v$ is impressed on the input terminal 1, the current $i$ flowing through the load 8 is expressed by $$i = \frac{v}{R_L + \tfrac{1}{2} R_e}$$

Since one half of the load current $i$ flows through each of the resistors 5 and 6, the current flowing through the transistors 3 is $I_o + i/2$ whereas the current flowing into the transistor 4 is $I_o + i/2$.

The reference point of the first power supply 9 and 10 is always following the input voltage $v$ so that the collector-emitter voltage of the transistor 3 or 4 is constant and is expressed by $\tfrac{1}{2}V_1 - I_o R_e$. Hence the instantaneous power loss $P_{cl}$ of the transistors 3 and 4 is expressed by $$P_{cl} = (I_o + \tfrac{i}{2})(\tfrac{1}{2} V_1 - I_o R_e) + (I_o - \tfrac{i}{2})(\tfrac{1}{2} V_1 - I_o R_e)$$
$$= 2I_o(\tfrac{1}{2} V_1 - I_o R_e) = P_{col}$$

The instantaneous power loss is therefore equal to that with no input signal and is constant.

The average power loss $P_{c2}$ of the transistors 12 and 13 in Class-B operation is expressed by $$P_{c2} = k(\tfrac{1}{\pi} - \tfrac{k}{4}) \cdot \frac{V_2^2}{2R_L}$$

where $k = V/V_m$. Therefore the overall power loss of the power amplifier or transistors 3, 4, 12 and 13 is expressed by $$P_c = 2I_o(\tfrac{1}{2} V_1 - I_o R_e) + k(\tfrac{1}{\pi} - \tfrac{k}{4}) = \frac{V_2^2}{2R_L}$$

Assume that the collector-emitter voltage ($\tfrac{1}{2}V_1 - I_o R_e$) of the transistors 3 and 4 is set to 1/10 of $\tfrac{1}{2}V_2$ (This is reasonable in practice) and that the idling current $I_o$ of the transistors 3 and 4 is set to a half of the peak current of the load $\tfrac{1}{2}V_2/R_L$, and then the; power loss $P_{cl}$ of the transistors 3 and 4 is expressed by $$P_{cl} = 2I_o \frac{V_2}{20} = \frac{V_2^2}{40R_L}$$

which is 0.2 times as much as the maximum output power $P_{om}$ because $P_{om} = v_2^2/8R_L$. The curve $g$ in FIG. 4 shows the relationship between the ratio of the overall power loss $P_c$ to the maximum output power $P_{om}$ and the ratio of the output voltage V to the maximum output voltage $V_m$, when the collector-emitter voltage of the transistors 3 and 4 is set to 1/10 of $\tfrac{1}{2}V_2$.

From the curves $e$, $f$ and $g$ shown in FIG. 4, it is seen that the power loss of the first embodiment is slightly higher than the power loss of the Class-B power amplifier, but is by far smaller than the power loss of the Class-A power amplifier. In addition, the first embodiment has an advantage in that no switching distortion results because the load 8 in driven in Class-A operation.

In the first embodiment shown in FIG. 5, whereas the transistors 3 and 4 in the first amplifier stage are provided with the emitter resistors 5 and 6, respectively, the transistors 12 and 13 in the second amplifier stage are not provided, but it is preferable to connect emitter resistors to the transistors 12 and 13 in order to stabilize the idling current of the second amplifier stage. With the increase in output amplitude, the output current flows through the emitter resistors of the transistors 12 and 13 so that the voltage drops across the emitter resistors reduce the margine of the collector-emitter voltage of the transistors 3 and 4. Therefore the collector-emitter voltage of the transistors 3 and 4 must be increased for compensation with the resultant increase in power loss. This offsets the advantages of the present invention. Therefore it is preferable to connect a diode in the forward direction and in parallel with the emitter resistor of each transistor 12 or 13.

In the first embodiment shown in FIG. 5, whereas the input signal is provided directly to the first and second amplifier stages, but it is possible to provide the input signal through another two amplifiers, voltage gains of which are almost the same, to the first and second amplifier stages. In this case, it is effective to set the voltage gain of the one amplifier for the first amplifier stage slightly smaller than that of the other to compensate the voltage drops of the emitter resistors of the transistors 12 and 13.

Figure 6:
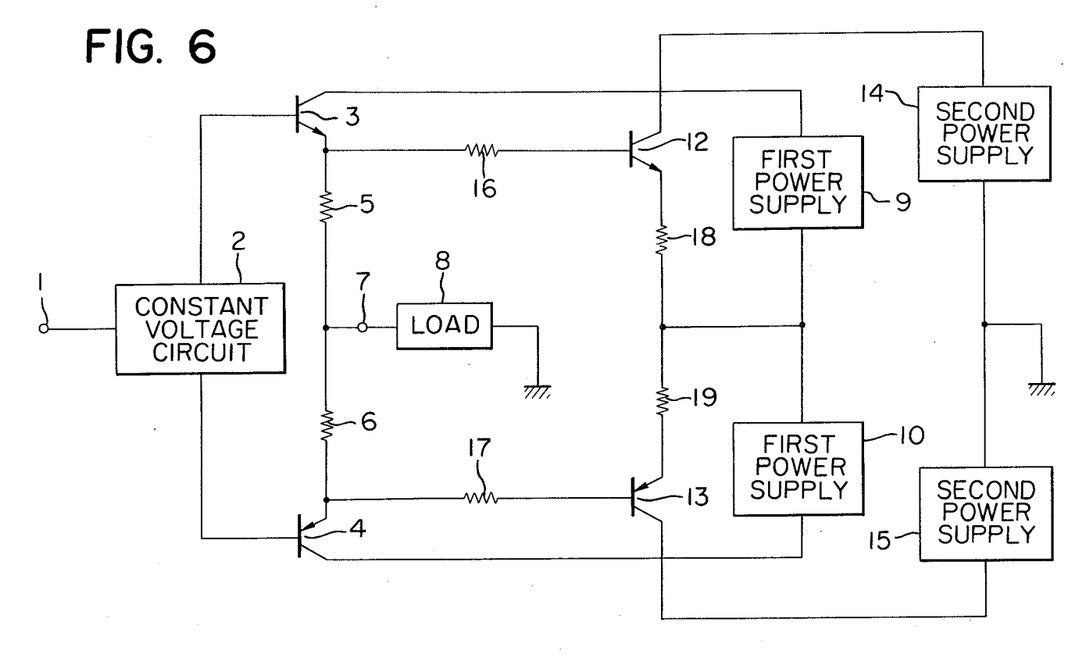

Modification of the first embodiment, FIG. 6

Whereas the bases of the transistors 12 and 13 in the second amplifier stage of the first embodiment shown in FIG. 5 are connected to the constant voltage circuit 11 which in turn is connected to the input terminal 1, in the modification shown in FIG. 6 the bases are connected through resistors 16 and 17, respectively to the emitters of the transistors 3 and 4, respectively, and emitter resistors 18 and 19 are connected to the transistors 12 and 13. This arrangement is advantageous in that the circuit may be made simple in construction, the load on the input terminal 1 may be reduced and the variation or distortion in base current due to the switching operations of the transistors 12 and 13 may not be transmitted to the input terminal 1.

Figure 7:
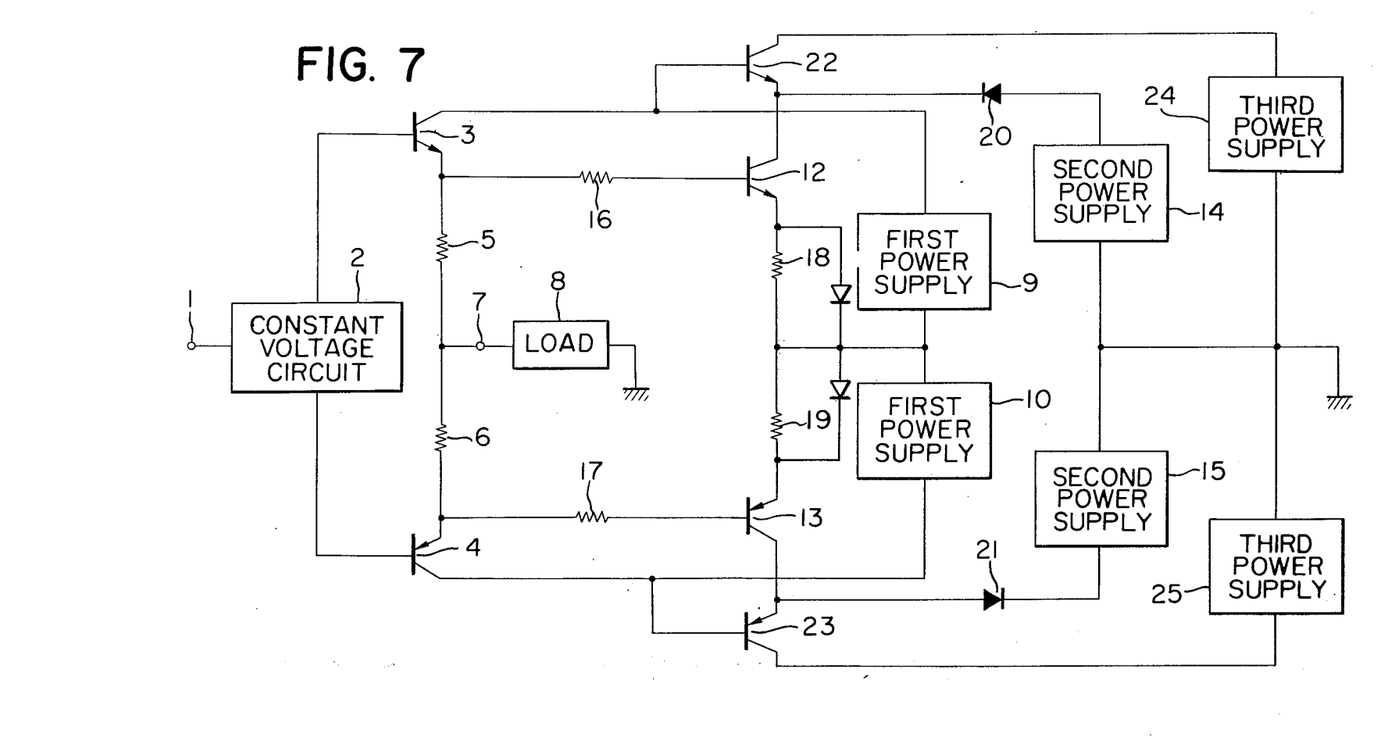

Second Embodiment, FIG. 7

The second embodiment shown in FIG. 7 is similar in construction to the modification shown in FIG. 6 except that diodes 20 and 21 and transistors 22 and 23 and a third pair of power supplies 24 and 25 are added in order to further reduce the power loss of the second amplifier stage as compared with the prior art Class-B amplifier.

In the second embodiment shown in FIG. 7 when the output amplitude is within the voltage $\pm \frac{1}{2}V_2$ of the second power supply, the collector voltages of the transistors 12 and 13 are supplied from the second power supply 14 and 15 through the diodes 20 and 21, but when the output amplitude exceeds $\pm \frac{1}{2}V_2$, the collector voltages are supplied from the third power supply 24 and 25 through the transistors 22 and 23. Therefore the maximum overall power loss of the transistors 12, 13, 22 and 23 may be made smaller than the maximum power loss of the transistors 12 and 13 of the circuit shown in FIG. 6. For instance, assume that the voltage of the second power supply be set to 0.7 of that of the third power supply, and then the maximum power loss may be reduced about one half of the power loss of the circuit shown in FIG. 6.

The bases of the transistors 22 and 23 may be connected to the input terminal 1, the output terminal 7 or the output terminal of the second amplifier stage, but in the second embodiment they are directly connected to the second power supply so that a circuit for biasing the bases may be eliminated and the saturation between the collector and emitter of the transistor 12 or 13 may be prevented.

In the first and second embodiments shown in FIGS. 5, 6 and 7, instead of the transistors 3 and 4 in the first amplifier stage, the transistors 12 and 13 in the second amplifier stage and the transistors 22 and 23 for switching the second and third power supplies may be partly or wholly replaced with field-effect transistors.

In summary, the first and second embodiments shown in FIGS. 5, 6 and 7 have the advantages in that as with the Class-A power amplifiers no switching distortion occurs and that the power loss is by far smaller than the ower loss of the prior art Class-A power amplifiers.

Figure 8:
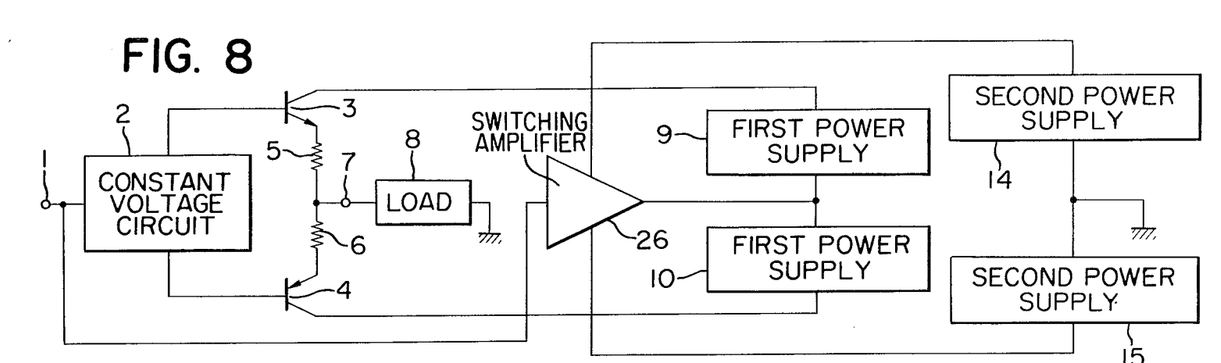

Third Embodiment, FIG. 8

The third embodiment shown in FIG. 8 is substantially similar in construction to the first embodiment shown in FIG. 5 except that instead of the constant voltage circuit 11 and the transistors 12 and 13 in the second amplifier stage, a switching amplifier 26 is inserted. In this embodiment, the first amplifier stage consisting of the transistors 3 and 4 is Class-A or -B operated, whereas the switching amplifier 26, Class-D operated. The voltage of the first power supply 9 and 10 is selected as low as possible to minimize the power loss of the transistors 3 and 4, and the junction point of the first pair of power supplies 9 and 10 is connected to the output of switching amplifier 26 so that the first power supply may be driven following the output voltage.

In the third embodiment, the collector-emitter voltage of the transistors 3 and 4 is maintained as low as possible so that the power loss may be minimized, whereas the power loss of the switching amplifier 26 is negligible because of the Class-D operation. As a consequence the overall power loss is considerably reduced as compared with the prior art Class-A or -B power amplifiers.

As to the distortion, it may be substantially eliminated as compared with the prior art Class-D power amplifiers because as with the prior art Class-A and -B power amplifiers, a negative feedback may be provided between the input and output terminals. In addition, because of the negative feedback the frequency characteristic may be remarkably improved and the ripple voltage may be substantially removed as compared with the prior art Class-D power amplifiers. In the prior art Class-D power amplifiers, a considerably high switching frequency must be selected in order to improve the frequency characteristic in the higher range and to satisfactorily remove the ripple of a switching frequency. As a result, spurious radiation as well as switching loss increase. But the Class-D amplifier stage in the third embodiment shown in FIG. 8 has any direct effect on the frequency characteristic and the switching-frequency ripple is suppressed by the transistors 3 and 4 from being transmitted to the output terminal 7. Therefore a lower switching frequency may be selected and consequently the undesired radiation and switching loss may be reduced.

Figure 9:
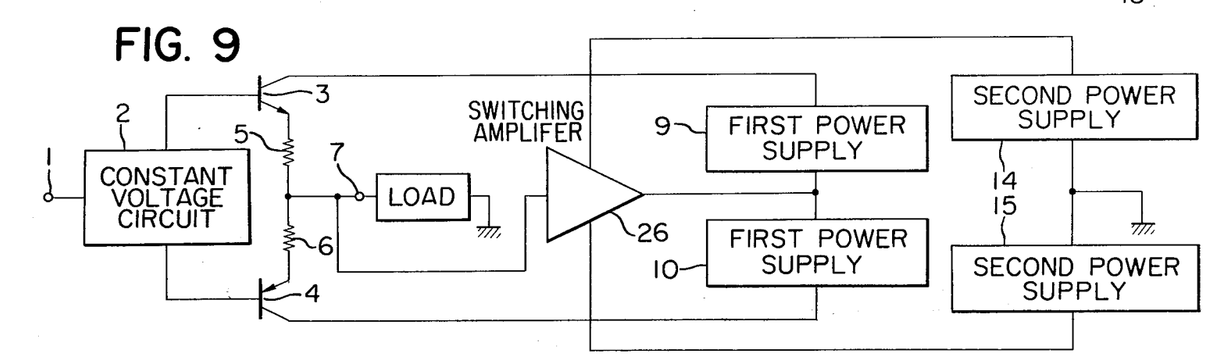

Modification of the third embodiment, FIG. 9

Modification of the third embodiment shown in FIG. 9 is substantially similar in construction to the third embodiment shown in FIG. 8 except that the input terminal of the switching amplifier 26 or the second amplifier stage is connected to the output terminal 7 instead of the input terminal 1. The modification of the third embodiment may attain the same effects as the third embodiment.

In the third and the modification of third embodiments shown in FIGS. 8 and 9, the switching amplifier 26 may be of the conventional externally excited type wherein an input and an output from a triangular waveform generator are compared for the pulse-width modulation or self-excited type wherein an input and an output from a low-pass filter are compared and a pulse-width modulated square waveform is excited.

Figure 10:
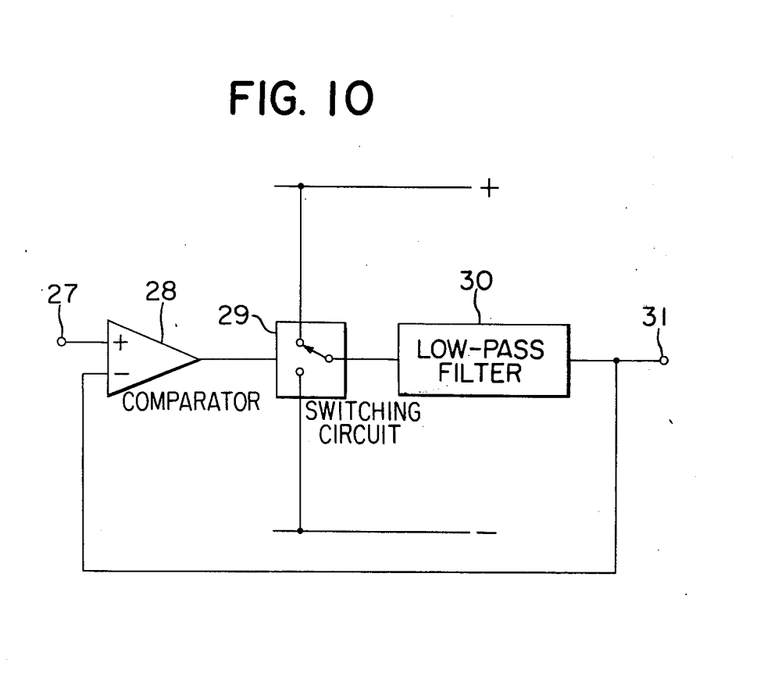
FIG. 10 is a circuit diagram of a self-excited switching amplifier used in the third and fourth embodiments shown in FIGS. 8 and 9, respectively.

In FIG. 10 there is shown a self-excited switching amplifier with an input terminal 27, a comparator 28, a switching circuit 29, a low-pass filter 30 and an output terminal 31. The comparator 28 compares a signal impressed at the input terminal 27 with a signal at the output terminal 31 to derive a square waveform output to drive the switching circuit 29. The square waveform output from the switching circuit 29 is applied to the low-pass filter 30 to derive at the output terminal 31 the composite signal consisting of a low frequency component and small ripples component at a switching frequency. As shown in FIG. 10, this circuit establishes a feedback loop which effects the negative feedback in the low frequency range but effects the positive feedback in the high range at a frequency of at which the phase shift of the low-pass filter 30 is -180° and at which the switching amplifier oscillates.

Figure 11:
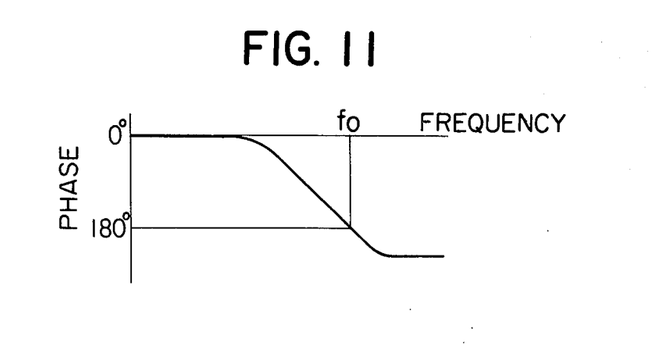
FIG. 11 is a view used for the explanation of the mode of operation of the switching amplifier shown in FIG. 10.

FIG. 11 shows the frequency-phase characteristic of the low-pass filter 30. With no input signal, the duty cycle of square waveform output from the comparator 28 is 50%, but with an input signal the duty cycle changes so that the low frequency component of the feedback signal follows the input signal. Consequently, the low frequency component of the output signal is similar to the input signal; that is, the amplification is effected.

In summary, the power amplifiers in accordance with the present invention may perform the same operation as the prior art Class-A power amplifiers but the power loss is considerably lower as compared with the latter. In addition, they may perform the same operation as the Class-B power amplifiers but the power loss is also considerably lower as compared with the latter.

What is claimed is:

1. A power amplifier comprising
   (a) a first amplifier for driving a load in response to an input signal, said first amplifier comprising a first complementary symmetry transistor push-pull circuit and having an operating point for Class-A or Class-B operation,
   (b) a first power supply with a floating reference point for supplying a voltage to said first amplifier,
   (c) a second amplifier for driving said first power supply in response to the input signal, said second amplifier comprising a second complementary symmetry transistor push-pull circuit and having an operating point for Class-AB or Class-B operation, and
   (d) a second power supply with a fixed reference point for supplying a voltage to said second amplifier, said first and second power supplies each comprising a positive power supply and a negative power supply interconnected at a common junction point, and said second amplifier drives the junction point of said positive and negative power supplies of said first power supply.

2. A power amplifier as set forth in claim 1 wherein a first pair of series-connected resistors are interconnected between first main electrodes of complementary transistors in said first push-pull circuit, a second pair of series-connected resistors is connected between first main electrodes of complementary transistors in said second push-pull circuit, and the junction point of said second pair of series-connected resistors is connected to the junction point between said positive and negative power supplies of said first power supply.

3. A power amplifier as set forth in claim 2 wherein a bias voltage is applied to the control electrodes of complementary transistors in said first and second push-pull circuits in such a way that the idling current flowing through said first pair of series-connected resistors is higher than the idling current flowing through said second pair of series-connected resistors.

4. A power amplifier as set forth in claim 2 wherein a diode is connected in parallel with each resistor of said second pair.

5. A power amplifier as set forth in claim 1 wherein said first amplifier drives said second amplifier.

6. A power amplifier, comprising:
   (a) a first amplifier for driving a load in response to an input signal,
   (b) a first power supply with a floating reference point for supplying a voltage to said first amplifier,
   (c) a second amplifier for driving said first power supply in response to the input signal,
   (d) second and third power supplies with a fixed reference point for supplying a voltage to said second amplifier,
   (e) a switching circuit for selectively connecting either of said second or third power supply to said second amplifier depending upon an output amplitude,
   (f) said third power supply having a higher a supply voltage than said second power supply, and
   (g) said switching circuit functioning in such a way that when the output amplitude is smaller than a predetermined voltage said second power supply supplies a voltage to said second amplifier and when the output amplitude is higher than said predetermined voltage, said third power supply supplies a voltage to said second amplifier.

7. A power amplifier as set forth in claim 6 wherein said first amplifier comprises a first complementary transistor push-pull circuit, said second amplifier consists of a second complementary transistor push-pull circuit, each of said first, second and third power supplies consists of a positive power supply and a negative power supply having a common junction point, said second amplifier drives the junction point between the positive and negative power sources of said first power supply, and said switching circuit comprises
   (a) two diodes interconnected in the forward direction between the positive and negative power supply and first main electrodes of said second push-pull circuit, and
   (b) a complementary pair of transistors each having a second main electrode connected to the junction between the diode and said second amplifier and another main electrode connected to a power supply terminal of said third power supply.

8. A power amplifier as set forth in claim 7 wherein said first amplifier has an operating point for Class-A or Class-AB operation, while said second amplifier has an operating point for Class-AB or Class-B operation.

9. A power amplifier as set forth in claim 7 wherein a first pair of series-connected resistors are interconnected between first main electrodes of complementary transistors in said first push-pull circuit, a second pair of series-connected resistors is connected between first main electrodes of complementary transistors in said second push-pull circuit, and the junction point of said second pair of series-connected resistors is connected to the junction point between the positive and negative power supplies of said first power supply.

10. A power amplifier as set forth in claim 9 wherein a bias voltage is applied to the control electrodes of complementary transistors in said first and second push-pull circuits in such a way that the idling current flowing through said first pair of series-connected resistors is higher than the idling current flowing through said second pair of series-connected resistors.

11. A power amplifier as set forth in claim 9 wherein a diode is connected in parallel with each of said second pair of series-connected resistors.

12. A power amplifier as set forth in claim 7 wherein the control electrodes of complementary transistors of said switching circuit are connected to the positive and negative power supplies, respectively, of said first power supply.

13. A power amplifier as set forth in claim 12 wherein said first amplifier has an operating point for Class-A or Class-AB operation, while said second amplifier has an operating point for Class-AB or Class-B operation.

14. A power amplifier as set forth in claim 12 wherein a first pair of series-connected resistors are interconnected between first main electrodes of complementary transistors in said first push-pull circuit, a second pair of series-connected resistors is connected between first main electrodes of complementary transistors in said second push-pull circuit, and the junction point of said second pair of series-connected resistors is connected to the junction point between the positive and negative power supplies of said first power supply.

15. A power amplifier as set forth in claim 14 wherein a bias voltage is applied to the control electrodes of complementary transistors in said first and second push-pull circuits in such a way that the idling current flowing through said first pair of series-connected resistors is higher than the idling current flowing through said second pair of series-connected resistors.

16. A power amplifier as set forth in claim 14 wherein a diode is connected in parallel with each resistor of said second pair.

17. A power amplifier as set forth in claim 12 wherein said first amplifier drives said second amplifier.

18. A power amplifier asset forth in claim 6 wherein said first amplifier drives said second amplifier.

19. A power amplifier comprising
(a) a first amplifier for driving a load in response to an input signal, said first amplifier having an operating point for Class-A or Class-B operation,
(b) a first power supply with a floating reference point for supplying a voltage to said first amplifier,
(c) a second amplifier for driving said first power supply in response to the input signal, said second amplifier having an operating point for Class-D operation, and
(d) a second power supply with a fixed reference point for supplying a voltage to said second amplifier.

20. A power amplifier as set forth in claim 19 wherein said first amplifier comprises of a complementary transistor push-pull circuit, each of said first and second power supplies comprises series-connected positive and negative power supplies, and said second amplifier drives the junction point between the positive and negative power supplies of said first power supply.

21. A power amplifier as set forth in claim 19 wherein said first amplifier dirves said second amplifier.

22. A power amplifier as set forth in claim 21 wherein said second amplifier comprises of a self-excited switching amplifier.

23. A power amplifier as set forth in claim 19 wherein said second amplifier comprises a self-excited switching amplifier.

* * * * *

UNITED STATES PATENT OFFICE
CERTIFICATE OF CORRECTION

Patent No. 4,115,739          Dated September 19, 1978

Inventor(s) Nobuya Sano, et al.

It is certified that error appears in the above-identified patent and that said Letters Patent are hereby corrected as shown below:

Column 4, line 21:

Change "$P_c = 2I_o(\frac{1}{2}V_1 - I_oR_e) + k(\frac{1}{\pi} - \frac{k}{4}) = \frac{V_2^2}{2R_L}$" to --$P_c = 2I_o(\frac{1}{2}V_1 - I_oR_e) + k(\frac{1}{\pi} - \frac{k}{4}) \cdot \frac{V_2}{2R_L}$--.

Column 4, line 49: change "load 8 in driven" to --load 8 is driven--.

Column 4, line 51: cancel "whereas".

Column 4, line 53: after "respectively," add --and--.

Column 4, line 55: change "not" to --also--; change ",but it preferable to connect" to --with--.

Column 4, line 56: cancel "to the transistors 12 and 13".

UNITED STATES PATENT OFFICE
CERTIFICATE OF CORRECTION

Patent No. 4,115,739

Dated September 19, 1978

Inventor(s) Nobuya Sano, et al.

It is certified that error appears in the above-identified patent and that said Letters Patent are hereby corrected as shown below:

Column 4, line 61: change "margine" to --margin--.

Column 6, line 2: change "ower loss" to --power loss--.

Column 7, line 38: change "class-B" to --class-AB --.

Column 8, line 25: change "a higher a" to --a higher--.

Column 8, line 45: after "negative" insert --power sources of said second--.

Column 10, line 6: change "asset" to --as set--.

Column 10, line 29: change "dirves" to --drives--.

Signed and Sealed this

Twenty-sixth Day of June 1979

[SEAL]

Attest:

RUTH C. MASON
Attesting Officer

DONALD W. BANNER
Commissioner of Patents and Trademarks